United States Patent [19]
Shi et al.

[11] Patent Number: 5,630,947
[45] Date of Patent: May 20, 1997

[54] METHOD OF MAKING A MULTICHIP MODULE COMPRISING AT LEAST ONE THIN FILM PROBE

[76] Inventors: Shei-Kung Shi, 6007 Porto Alegre Dr., San Jose, Calif. 95120; Fu-Hsiang Tseng, 19961 Buckhaven La., Saratoga, Calif. 95070; Chong-Kai Kuo, 3582 Pleasant Echo Dr., San Jose, Calif. 95148

[21] Appl. No.: 365,135

[22] Filed: Dec. 28, 1994

[51] Int. Cl.⁶ .................. H05K 3/02; H01K 3/10
[52] U.S. Cl. .................. 216/18; 29/846; 29/852
[58] Field of Search ................. 216/18; 29/846, 29/847, 852

[56] References Cited

U.S. PATENT DOCUMENTS

| | | | |
|---|---|---|---|
| 4,720,324 | 1/1988 | Hayward | 216/18 |
| 4,970,106 | 11/1990 | DiStefano et al. | 216/18 |
| 5,091,769 | 2/1992 | Eichelberger | 257/687 |
| 5,109,601 | 5/1992 | McBride | 29/846 |

Primary Examiner—P. W. Echols
Attorney, Agent, or Firm—Bacon & Thomas

[57] ABSTRACT

The present invention relates to the preparation of a multichip module comprising one or more thin film probes. The thin film probes are useful in in situ probe testing of IC chips. An assembly comprising the multichip module and a circuit board having IC chips in a number corresponding to the number of thin film probes is also claimed.

9 Claims, 3 Drawing Sheets

METHOD OF MAKING A MULTICHIP MODULE COMPRISING AT LEAST ONE THIN FILM PROBE

BACKGROUND OF THE INVENTION

1. Field of the Invention

The invention relates to the fabrication of an improved thin film probe for use in a multichip module (MCM) having improved test reliability and having the capability of in-situ testing and assembly.

2. Description of the Prior Art

Two of the key factors that limit the rapid growth of MCM technology have been the high cost and the availability of bare die that have the same quality and reliability as packaged devices. The present thin film probe is designed and fabricated to improve these two factors. It can economically test and characterize IC chips both in wafer form and as bare die prior to packaging. The thin film probe is able to produce Known Good Die (KGD), which is crucial to the wide adoption of advanced technology such as multichip module (MCM) and Chip on Board (COB).

In traditional MCM processes, before testing of the IC chips, all the IC chips are assembled on the substrate. If one chip fails during testing, the whole substrate is discarded. Costs are thus expensive and it takes a lot of time to replace the bad IC chips which are soldered on the substrate. Therefore, the manufacturing cost is increased in the prior processes. It is thus necessary to propose a novel probe and method of MCM fabrication to improve the test reliability and reduce the manufacturing costs of MCMs.

SUMMARY OF THE INVENTION

An objective of the invention is to provide a novel probe for use in place of the traditional metal probes. Reduction of capacitance and inductance by this thin film probe improves the test reliability.

Another objective of the invention is to provide a novel probe to be used as a chip carrier. This chip carrier works as a temporary IC package and is able to produce Known Good Die (KGD).

A further objective of the invention is to provide a method of self-aligning a multichip module with the capability of in-situ probe testing and assembly. Manufacturing cost is reduced by this technique.

In accordance with the first and second objectives of the invention, the probe is a thin film probe. The process is based on thin film technology fabricated on transparent or non-transparent material. The probe is made of a soft material on the bottom and a single tip head or multiple tip heads formed from a hard conducting material such as W, TiW or Nickel alloys on the top.

In accordance with the third objective of the invention, the high reliability MCM substrate is fabricated by a silicon wafer process. The topmost layer on the MCM base comprises tip heads which are made of a hard material with a solder material underneath. The finished MCM base is attached to a MCM package or a circuit board. Pads of IC chips are then placed and self-aligned to the thin film probe of the MCM base. The IC chips are pressed against the substrate by a fixed torque. If the tests pass, the solder is heated and the pads of the IC chips are bonded to the MCM base.

BRIEF DESCRIPTION OF THE DRAWINGS

The invention itself as well as other features and advantages thereof will be best understood by reference to the detailed description which follows, read in conjunction with the accompanying drawings.

DESCRIPTION OF THE PREFERRED EMBODIMENT

Figure 1:
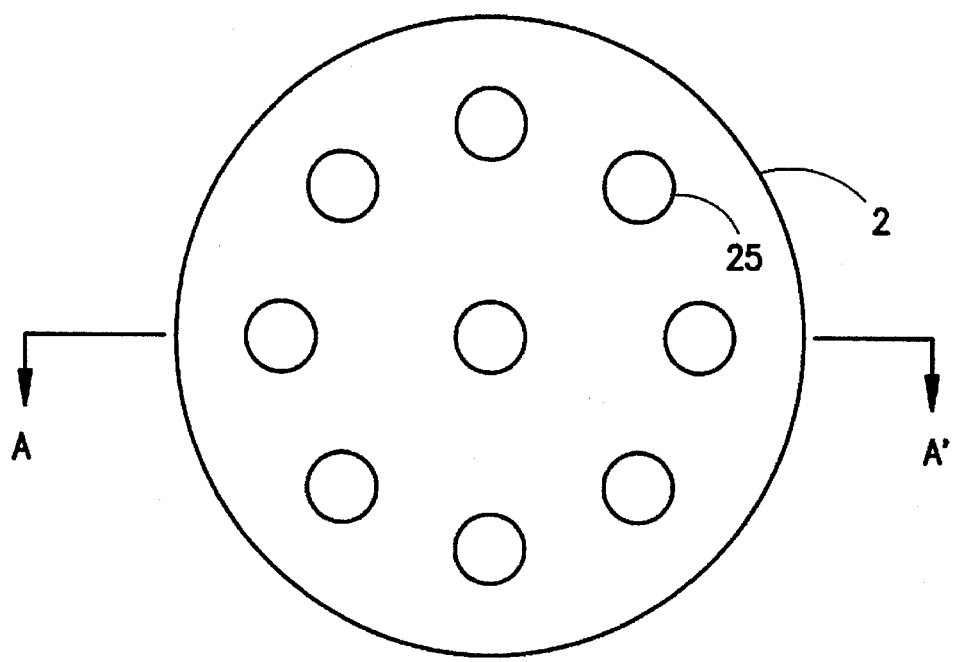
FIG. 1 is the top view of a thin film probe having tip heads according to the invention.
Figure 2A:
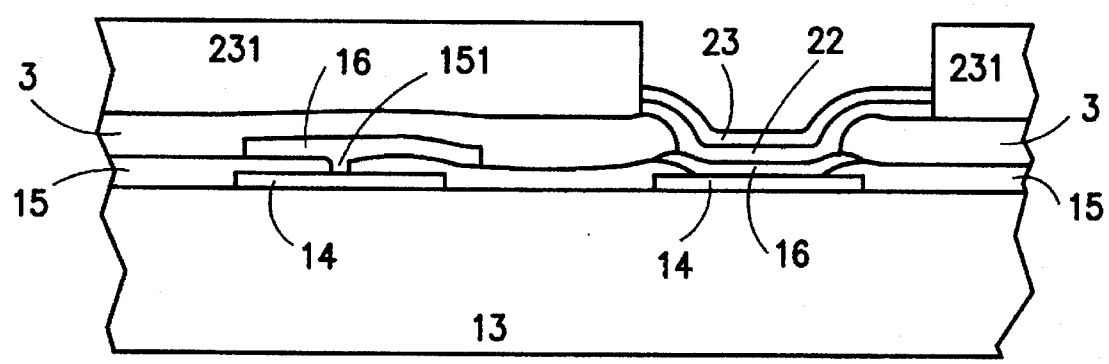
FIGS. 2A–2C are cross-sectional views of crucial fabricating steps from the A—A' line of FIG. 1 and interconnecting metal layers near the thin film probe.
Figure 2B:
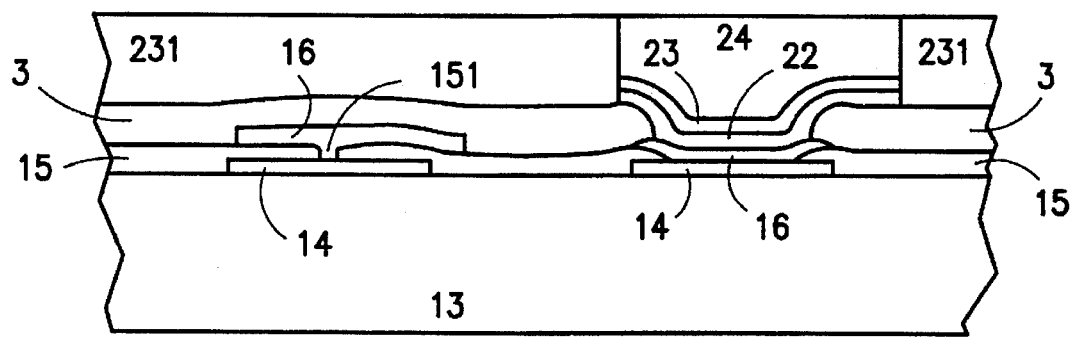
Figure 2C:
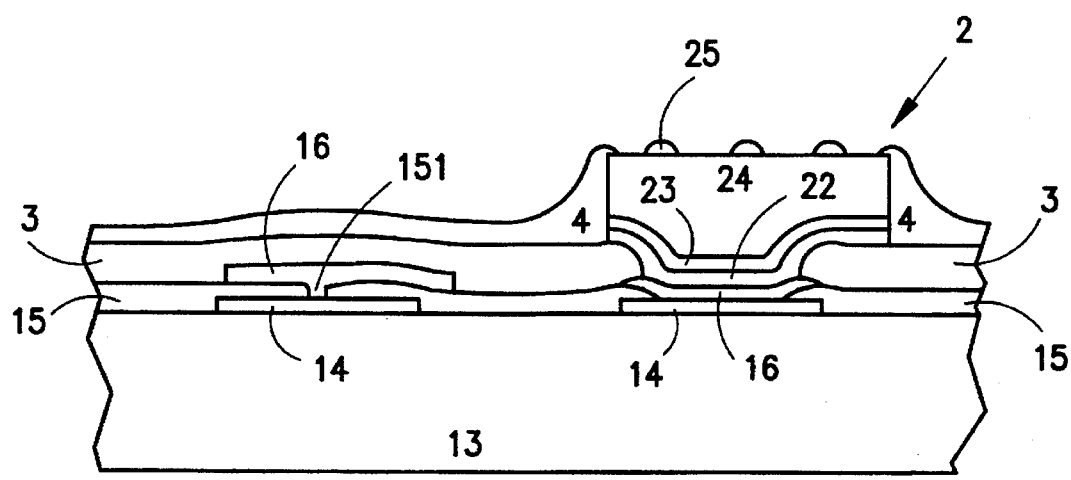

The invention of MCM fabrication substantially includes two processes—that is, the production of a multichip module base, and the assembly of IC chips and the multichip module base. The fabrication process of the multichip module base will be disclosed first. The number and the spatial location of thin film probes on the MCM base are a one to one correspondence to those pads of all IC chips to be utilized. FIG. 1 is the top view of a thin film probe 2 having nine tip heads 25. FIGS. 2A–2C are cross-sectional views of crucial fabricating steps from the A—A' line of FIG. 1 and some interconnecting metal layers near the thin film probe. The numeral 13 of FIG. 2 represents the substrate. The use of a transparent substrate can make the alignment between the thin film probe and the pads of the IC chips more feasible. The transparent material can be glass, quartz or epoxy, etc.

The MCM base of FIG. 2A is made of a substrate 13 on its bottom, a multimetal layer structure (14, 15, 16, 3) on its middle part, and thin film probe 2 on its top. The multimetal layers are used for signal lines, power, ground lines and planes. A first metal layer 14 is deposited on substrate 13 and subjected to a process of photolithography to form the desired pattern. Subsequently, an intermetal dielectric layer 15, a second metal layer 16 and a second intermetal dielectric layer 3 are deposited in this order and patterned by photomasking, developing and etching, as shown in FIG. 2A. The intermetal dielectric layer comprises oxide or polyimide. Some vias 151 are formed on the intermetal dielectric layer 15. This process is repeated until the desired layers of metal and dielectric are deposited and patterned. For simplicity, only two layers of metal 14, 16 and dielectric 15, 3 are shown in the figures. After the patterning of the last dielectric layer 3 is finished, a Cr film 22 and a Cu film 23 are then deposited in this order to a depth of 0.1 micrometer and 0.8 micrometer, respectively.

Figure 3:
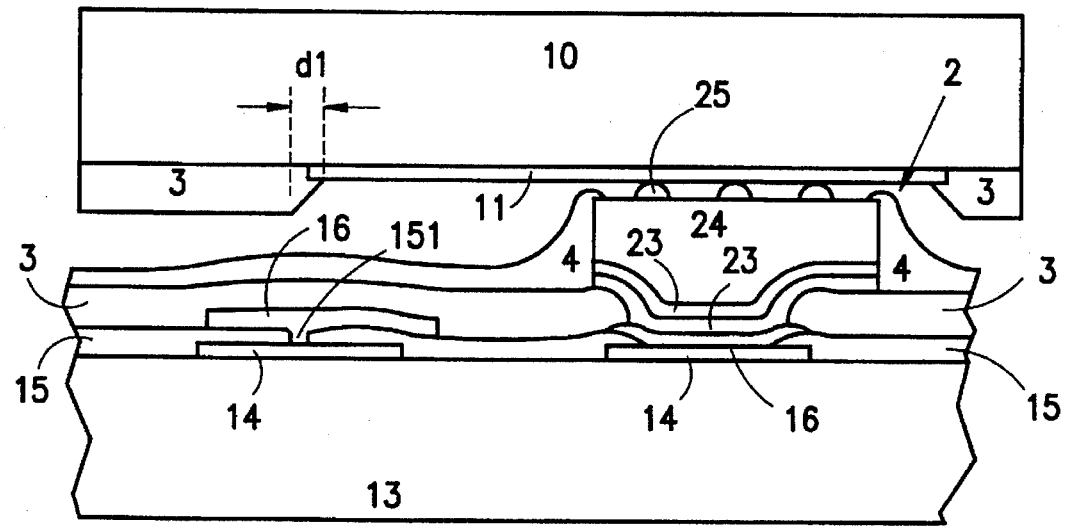
FIG. 3 is a schematic cross-sectional view of self-alignment between the multichip module base and the bonding pads of the IC chips.
Figure 4:
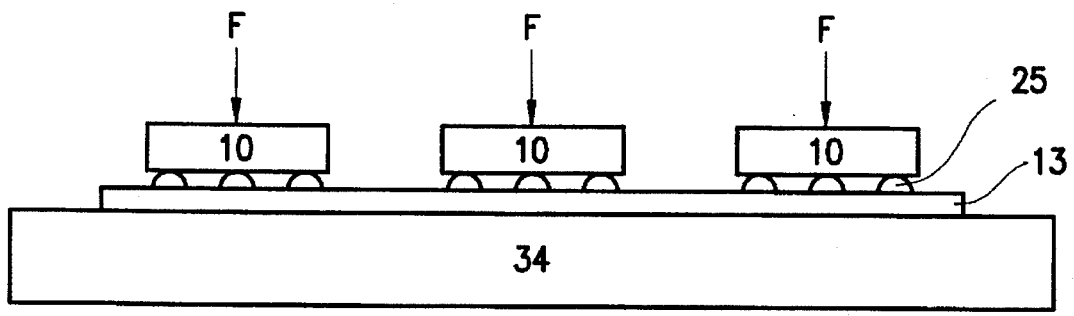
FIG. 4 is a schematic cross-sectional assembly view of IC chips and a multichip module base with the thin film probe situated therebetween.

Subsequently, a polyimide 231 is coated on the whole surface of the substrate to a thickness of 10 micrometers. By use of photomasking and developing, recesses are formed which define the intended position of thin film probe 2 as shown in FIG. 2A. The diameter of the recesses is generally about 40 micrometers. Thereafter, a step of electroplating follows to fill the recesses with low hardness solder material 24, such as Pb/Sn. The solder material has two functions. One is to be used as a cushion or spring during scrubbing of the high hardness tip heads to bonding pads; the other is used as the solder material to ultimately bond the IC chips to the MCM base. The substrate is then heated to about 200° C. and the solder material melts to form a spherical shape. A mechanical polishing step polishes the polyimide 231 and solder 24 simultaneously to a depth of about 8 micrometers, thereby flattening the topography of MCM base as shown in FIG. 2B. The polyimide 231 is removed and the substrate is then subjected to deposition of a high hardness conducting material such as W, TiW or Ni alloy to a depth of 1 micrometer. The tip heads 25 are formed by finishing photoresist masking, exposing and etching the high hardness conducting material. For example, in FIG. 1 the thin film probe 2 has nine round tip heads 25. The high hardness of tip heads 25 is used to penetrate native aluminum oxide on the aluminum layer of the bonding pads of the IC chips. Finally, the photoresist is removed and nitride is deposited as a passivation layer 4, making only probe 2 exposed as shown in FIG. 2C, Finally, MCM bases are attached to packages or circuit boards 34. Wire bonding between MCM bases and packages or circuit boards 34 are done before in situ testing and assembling. Each IC chip is then aligned and placed on the MCM base. Generally speaking, the area of bonding pads 11 is the square of 76 micrometers, and the diameter of thin film probe 2 is about 40 micrometers. Therefore, the misalignment tolerance between bonding pads 11 and thin film probe 2 is calculated as half of 76 micrometers subtracting 40 micrometers and results in 18 micrometers. Current placement systems can achieve this accuracy. Moreover, any misalignment of tip heads 25 touching at the rim of pads 11 could be automatically corrected by pressing the backside of IC chips 10 with fixed torque. Therefore, the tip heads 25 will either directly fall inside the bonding pad openings or move along the passivation layer near the rim of bonding pads 11 and touch the aluminum layer eventually as shown in FIG. 3. The aligning steps repeat until all of the IC chips are self-aligned and pressed with fixed torque F as shown in FIG. 4. Subsequently, the testing of the whole MCM proceeds. If the tests are positive, the solder 24 is heated to about 200° C., bonding pads 11 of IC chips 10 to the MCM base, and the whole MCM fabrication is finished. Generally used substrates can tolerate such temperatures.

Some distinguishing features of the invention can be found when compared with traditional art:

(1) The present MCM probing test and assembly can be performed under in-situ conditions, while in the traditional art, all IC chips have to be assembled before testing. The present process is thereby simplified and the production cycle time is reduced. Moreover, the replacing of failed chips is feasible and inexpensive. Therefore, the invention can save the huge cost loss of MCM failure.

(2) The misalignment tolerance between bonding pads and thin film probe increases and thereby makes the process more stable, and more controllable. The nontransparent, nonconductive material such as a wafer, or the backside of LCD, can also be used as the MCM substrate in the invention due to also have large misalignment tolerance.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

We claim:

1. A process for preparing a multichip module comprising one or more thin film probes, which process comprises the steps of:

depositing a first metal layer evenly onto a transparent or non-transparent substrate;

masking and etching said first metal layer according to a predetermined pattern;

depositing an intermetal dielectric layer evenly thereover;

etching said layer according to a second predetermined pattern;

depositing a second metal layer evenly thereover;

etching said layer according to a third predetermined pattern;

depositing a second intermetal dielectric layer evenly thereover;

etching said layer such that vias are formed according to a fourth predetermined pattern;

evenly depositing a Cr film and then a Cu film thereover;

evenly depositing a polyimide layer thereover;

forming one or more recesses on the module by photomasking and developing to define a position for each thin film probe;

filling each recess with soldering material;

heating the multichip module to about 200° C. to melt the soldering material;

mechanically polishing the multichip module to flatten the polyimide and soldering material;

removing the polyimide;

depositing high hardness conducting material on the soldering material in each recess;

forming one or more tip heads by etching the high hardness material in each recess; and depositing a nitride layer on the multichip module such that only each thin film probe is exposed.

2. A process according to claim 1 wherein the substrate is glass, quartz or epoxy.

3. A process according to claim 1 wherein the first and second metal layers are comprised of aluminum copper and the intermetal dielectric layers comprise oxide or polyimide.

4. A process according to claim 1 wherein the hard conducting material is selected from the group consisting of W, TiW and Ni alloys.

5. A process according to claim 1 wherein the polyimide layer is about 10 micrometers deep.

6. A process according to claim 1 wherein the soldering material is an alloy of Au, Au/In or Pb/Sn.

7. A process according to claim 1 wherein the polyimide is deposited to a thickness of about 10 micrometers.

8. A process according to claim 1 wherein the Cr film is deposited to a thickness of about 0.1 micrometers and the Cu film is deposited to a thickness of about 0.8 micrometers.

9. A process according to claim 1 wherein the diameter of each recess is about 40 micrometers.

* * * * *